United States Patent [19]

Kawamoto et al.

[11] Patent Number: 5,511,798
[45] Date of Patent: Apr. 30, 1996

[54] EMI GASKET

[75] Inventors: Ryusaburo Kawamoto, Tokyo; Kengo Suzuki, Miyagi, both of Japan

[73] Assignee: NEC Corporation, Tokyo, Japan

[21] Appl. No.: 275,110

[22] Filed: Jul. 14, 1994

[30] Foreign Application Priority Data

Jul. 22, 1993 [JP] Japan ................................. 5-181466

[51] Int. Cl.⁶ ............................. F16J 15/32; H05K 9/00
[52] U.S. Cl. .......................... 277/205; 277/229; 277/901; 174/35 GC; 174/65 R
[58] Field of Search .................................. 277/205, 901, 277/215, 227, 229; 174/35 GC, 65 R, 65 G, 151

[56] References Cited

U.S. PATENT DOCUMENTS

| | | | |
|---|---|---|---|
| 3,742,119 | 6/1973 | Neuman | 174/65 R |
| 4,914,261 | 4/1990 | Tokumaru et al. | 174/65 R |
| 5,006,960 | 4/1991 | Kallin et al. | 174/65 R |
| 5,028,739 | 7/1991 | Keyser et al. | 174/35 GC |
| 5,194,696 | 3/1993 | Read | 174/65 R |
| 5,254,808 | 10/1993 | Rodrigues et al. | 174/65 R |
| 5,307,243 | 4/1994 | Sharp et al. | 174/65 G |
| 5,313,546 | 5/1994 | Toffetti | 174/65 R |

*Primary Examiner*—Daniel G. DePumpo
*Attorney, Agent, or Firm*—Whitham, Curtis, Whitham & McGinn

[57] ABSTRACT

An EMI gasket having a uniform V-shaped cross section. Parallel grooves are provided in an area on one arm of the V-shaped cross section. Each optical fiber is held by a groove of the parallel grooves. Two arms of the V-shaped crosssection are pressed toward each other by two parallel conductive plates which forms a shielding for the openings where optical fibers go through.

12 Claims, 3 Drawing Sheets

EMI GASKET

BACKGROUND OF THE INVENTION

This invention relates to an Electromagnetic Interference (hereinafter "EMI") gasket used for shielding electromagnetic or electrostatic interference through openings of a casing of an electronic device, and more particularly for shielding openings from which optical fibers are inserted in an optical communication apparatus.

Examples of heretofore used shielding devices are shown in FIG. 1 and FIG. 2. An optical fiber introduction in a casing shown by FIG. 1 is disclosed in a Japanese Utility Model Publication No. 1912/'90. Optical fibers 25 are inserted into a casing 21 through tubular conductors 22 and 23 connected to the casing 21. Diameters and lengths of these conductor tubes 22 and 23 are so determined as to prevent electromagnetic waves from entering casing 21 through the openings surrounding these conductor tubes.

In an example shown in FIG. 2, a gap 38 which is formed between a casing body 36 and a front panel 37 is also shielded by an EMI gasket 31 comprising an inner buffer member 32 and an outer conductive coating 33.

The inner diameters of the tubular conductors 22 and 23 are small for increasing shielding effect, and an optical fiber can barely pass through the inner diameter. Sometimes, it is very difficult to pass an optical fiber through the conductor. As the tubular conductors are made of metal, optical fibers may be damaged by the tubular conductors when external forces are improperly applied to the optical fibers. A tubular conductor is necessary for each optical fiber, raising total manufacturing cost of the casing. The EMI shield in the gap 38 also increases the production cost.

SUMMARY OF THE INVENTION

Therefore, a primary object of this invention is to provide an electromagnetic shielding made of inexpensive material and that is easily repaired which shields the gap between the casing and the front panel and the openings of the casing and holds optical fibers. Another object of this invention is to provide an electromagnetic shielding for shielding the gap and the openings of the casing by a same shielding means.

Still another object of the invention is to provide a pliable shielding material which does not damage the surface of an optical fiber when the surface is pressed to the material by an external force.

Still another object of this invention is to provide a method of repairing the shielding material wherein an optical fiber with a connector is easily held by an opening in the shielding material.

Still another object of this invention is to arrange an array of optical fibers in accordance with an array of printed circuit boards in the casing.

In order to achieve these objects, an EMI gasket having an inner buffer member and an outer conductive coating is used for the shielding material. Optical fibers are inserted through grooves cut in the EMI gasket, and electromagnetic waves which travel through the optical fibers are shielded by surrounding EMI gasket.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 1:
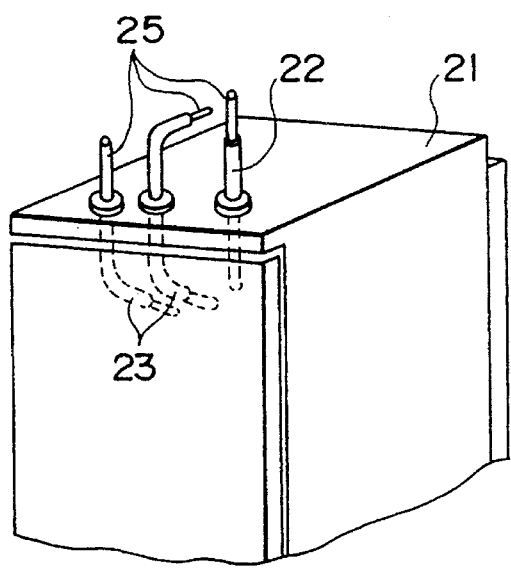
FIG. 1 shows a perspective view of a prior art.
Figure 2:
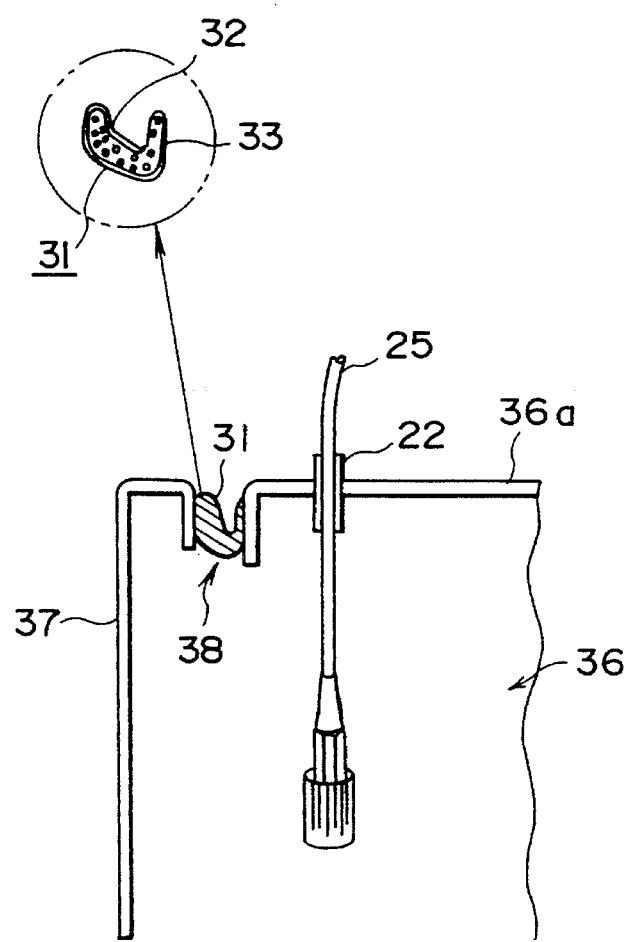
FIG. 2 shows a crosssectional view of another prior art.
Figure 3A:
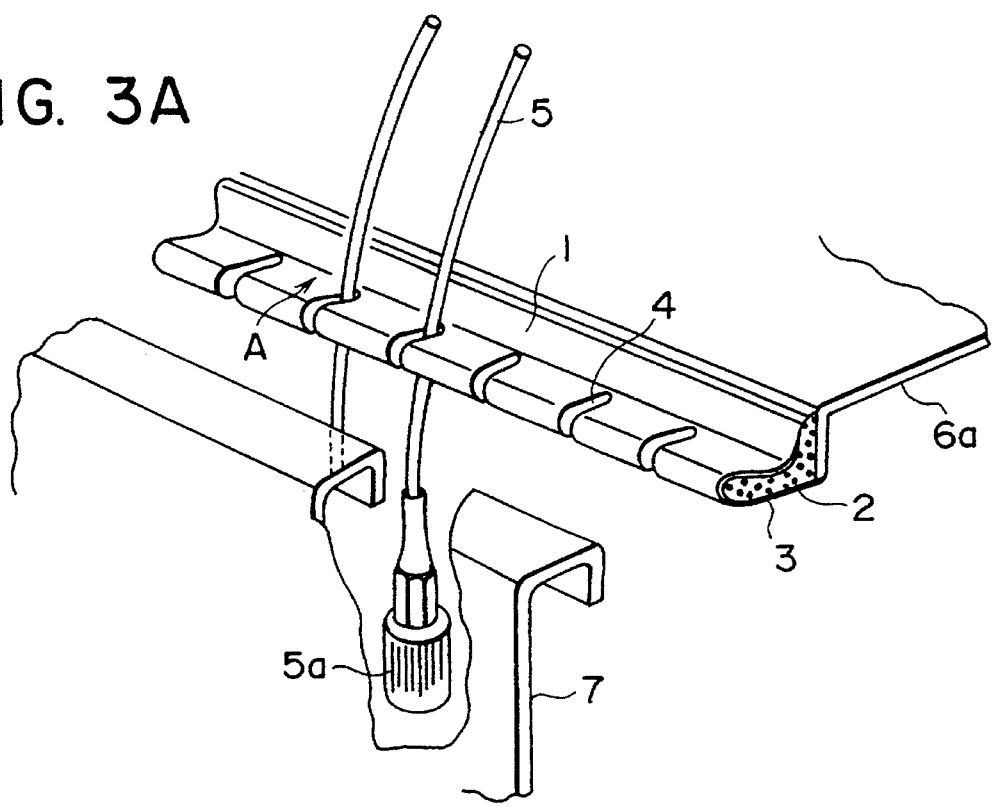
FIG. 3(a) shows a perspective view of an embodiment of this invention.

Referring to FIG. 3(a), a belt of EMI gasket 1, having a V-shaped crosssection, is fixed with a first side of the V-shape connected to a front upper surface of a casing body 6a.

Figure 3B:
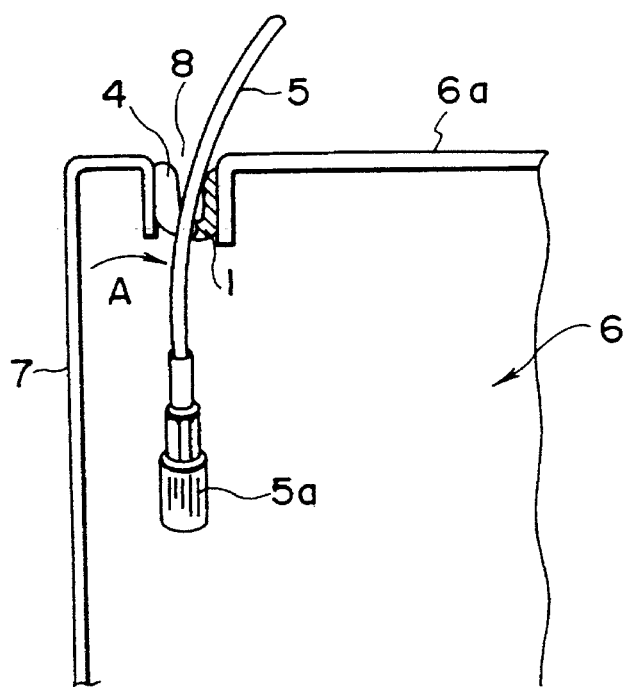
FIG. 3(b) shows a crosssectional view of an embodiment of this invention.
Figure 4:
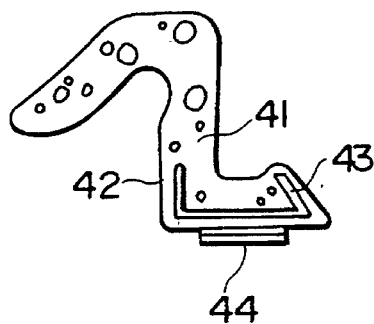
FIG. 4 shows a crosssectional view of an EMI gasket of FIG. 3.

An inner buffer member 2 of the EMI gasket 1 has V-shaped uniform crosssection made of compressible urethane foam. A crosssectional view of the EMI gasket in FIG. 3 is shown in FIG. 4, where independently foamed polyurethane 41 is coated with silver coating nylon fabric 42. A plastic insert 43 reinforces the belt of the EMI. The belt of the EMI is cut to length by scissors and adhered to the casing body 6a with double sided adhesive tape 44.

Parallel grooves 4 are formed in an area belonging to a second side of the V-shape in a direction perpendicular to the length of the EMI gasket. The width of a groove 4 is slightly smaller than the diameter of an optical fiber 5, and the fiber 5 is held by an elastic force of the inner buffer member 2. In one embodiment, surfaces of the grooves 4 have no conductive coating. This can reduce manufacturing cost of the EMI gasket 1, but may also reduce the shielding effect for shielding openings for optical fibers 5.

An optical fiber having a connector 5a can be easily held by a groove 4 before a front panel 7 is fastened to the upper surface of the casing body 6a. FIG. 3(b) shows a crosssection wherein the front panel 7 is fastened to the casing body 6a. An area of the EMI gasket 1 where grooves are formed is bent upward in a space 8 between the front panel 7 and the casing body 6a, pressing two sides of V-shaped crosssection together.

By fastening the front panel to the casing body 6a, a force is exerted which presses the two sides of V-shaped gasket together against an elastic force of the inner buffer member 2. The V-shaped EMI gasket 1 filling the gap 8 makes an excellent shield of the gap 8. As for the openings for optical fibers 5, the openings are surrounded by the outer conductive coating 3 of the EMI gasket that makes waveguides that cuts off the interfering waves.

There is no chance that an optical fiber 5 to be damaged, since the inner buffer member 3 is easily deformed when an external force is applied through the optical fiber 5.

Figure 5:
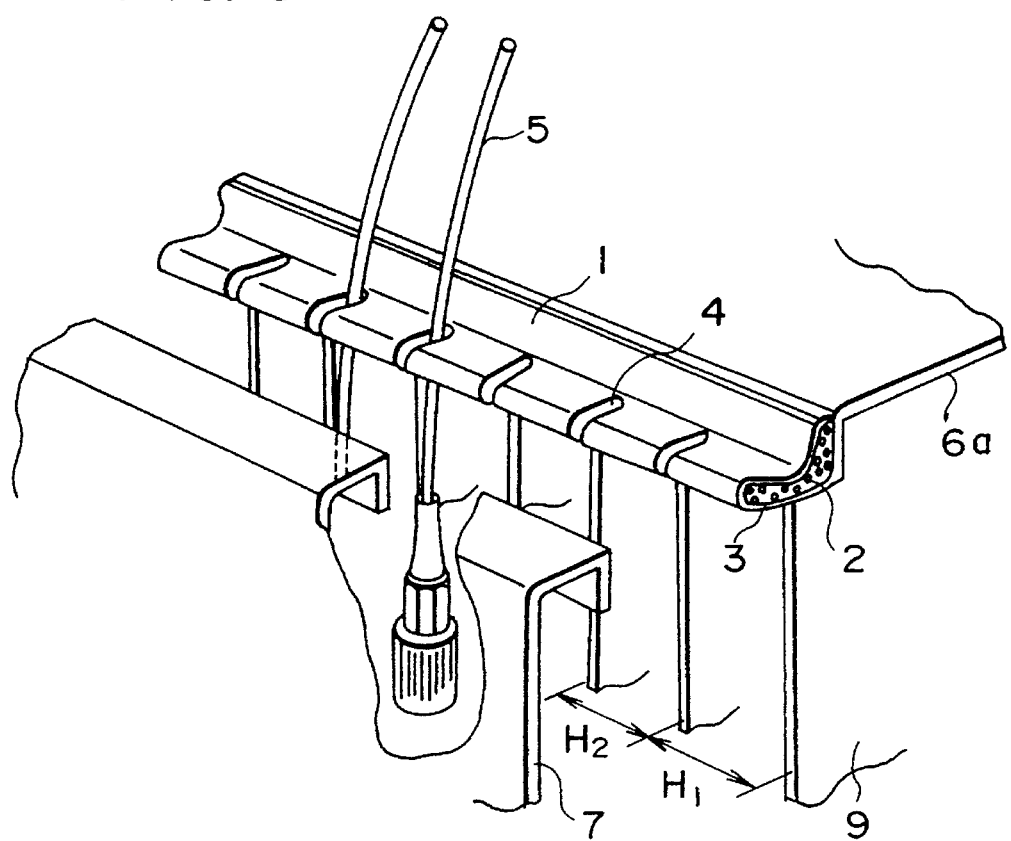
FIG. 5 shows a perspective view of another embodiment of this invention.

Another embodiment of this invention is shown in FIG. 5, wherein printed circuit boards 9 are arranged in an array in the casing 6, and the spacings between grooves 4 are determined in accordance with the spacings H1, H2 of the printed circuit boards 9. By this conformity of spacing, each optical fiber 5 is brought to an exact position where the optical fiber 5 is connected to a printed circuit board, thus facilitating connection work and avoiding erroneous connection.

Figure 6:
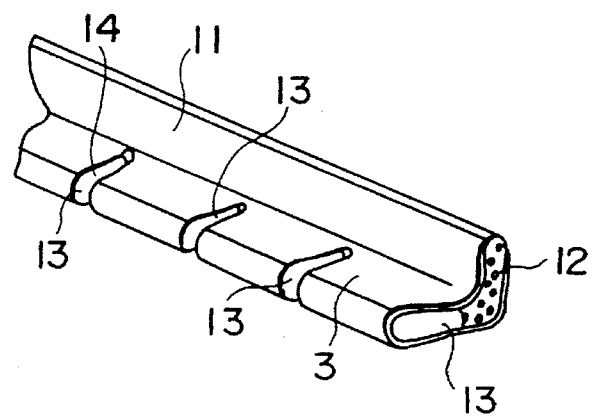
FIG. 6 shows a perspective view of still another embodiment of this invention.

In another embodiment of an EMI gasket 11 shown in FIG. 6, surfaces of the grooves 14 are covered with an outer conductive coating 13. This outer conductive coating 13 increases the shielding effect for the openings around the optical fibers.

In heretofore described embodiments, a V shaped EMI gasket belt is inserted in the gap 8 between the casing body 6a and the front panel 7, however, it is apparent that such gaps can be made in any desired place of the casing body 6a for inserting an array of optical fibers 5 in the casing 6.

What is claimed is:

1. An Electromagnetic Interference ("EMI") gasket for shielding electromagnetic or electrostatic interferences penetrating into a casing through openings, comprising:

a belt comprising an inner buffer member and having a V-shaped uniform cross-section and a length, said V-shaped cross section having a first side and a second side opposite said first side;

an outer conductive coating covering said belt;

a plurality of parallel grooves provided in said first side of said V-shaped cross-section of said belt, said parallel grooves being positioned in a direction perpendicular to the length of said belt;

means for holding an optical fiber in a groove of said parallel grooves; and means for holding said first side of said V-shaped cross-section toward said second side of said V-shaped cross section between two parallel conductive plates of said casing, and for compressing said belt between said two parallel conductive plates.

2. An EMI gasket of claim 1, wherein said inner buffer member comprises urethane foam.

3. An EMI gasket of claim 1, wherein said outer conductive coating comprises silver coating fabric.

4. An EMI gasket of claim 1, wherein said inner buffer member comprises independently foamed polyurethane and said outer conductsve coating comprises silver coating nylon fabric.

5. An EMI gasket of claim 1, wherein said casing further includes printed circuit boards and said parallel grooves are spaced in conformity with spacings of said printed circuit boards in said casing.

6. An EMI gasket of claim 1, wherein said parallel grooves are coated with said outer conductive coating.

7. An Electromagnetic Interference ("EMI") gasket for shielding electromagnetic or electrostatic interferences from penetrating between a casing and a front panel, comprising:

a belt comprising an inner buffer member and having a V-shaped uniform cross-section and a length, said V-shaped cross section having a first side and a second side opposite said first side:

an outer conductive coating covering said belt;

a plurality of parallel grooves provided in said first side of said V-shaped cross-section of said belt, said parallel grooves being positioned in a direction perpendicular to the length of said belt;

means for holding an optical fiber in a groove of said parallel grooves; and means for holding said first side of said V-shaped cross-section toward said second side of said V-shaped cross section between said casing and said front panel, and for compressing said belt between said casing and said front panel.

8. An EMI gasket of claim 1, further comprising means for bonding said first side of said V-shaped cross section with a plate of said parallel conductive plates.

9. An EMI gasket of claim 1, wherein said means for holding comprises frictional forces between said groove and said optical fiber.

10. An EMI gasket of claim 1, further comprising means, located within said inner buffer member, for supporting said belt along said length.

11. An EMI gasket of claim 10, wherein said means for supporting comprises a firm insert.

12. An EMI gasket of claim 1, wherein a width of said groove is less than a width of said optic fiber.

* * * * *